(12) United States Patent
Perez-Falcon

(10) Patent No.: US 11,892,779 B2
(45) Date of Patent: Feb. 6, 2024

(54) OPTICAL COMPONENT AND CLAMP USED IN LITHOGRAPHIC APPARATUS

(71) Applicant: ASML HOLDING N.V., Veldhoven (NL)

(72) Inventor: Victor Antonio Perez-Falcon, Bridgeport, CT (US)

(73) Assignee: ASML HOLDING N.V., Veldhoven (NL)

( * ) Notice: Subject to any disclaimer, the term of this patent is extended or adjusted under 35 U.S.C. 154(b) by 57 days.

(21) Appl. No.: 17/772,201

(22) PCT Filed: Oct. 21, 2020

(86) PCT No.: PCT/EP2020/079650
§ 371 (c)(1),
(2) Date: Apr. 27, 2022

(87) PCT Pub. No.: WO2021/089329
PCT Pub. Date: May 14, 2021

(65) Prior Publication Data
US 2022/0404720 A1     Dec. 22, 2022

Related U.S. Application Data

(60) Provisional application No. 62/931,906, filed on Nov. 7, 2019.

(51) Int. Cl.
*G03F 7/00*     (2006.01)
*G02B 7/18*     (2021.01)

(52) U.S. Cl.
CPC ....... *G03F 7/70891* (2013.01); *G02B 7/1815* (2013.01); *G03F 7/7015* (2013.01)

(58) Field of Classification Search
CPC .... G03F 7/70891; G03F 7/7015; G03F 7/707; G03F 7/70875; G02B 7/1815
See application file for complete search history.

(56) References Cited

U.S. PATENT DOCUMENTS

| 5,229,872 A | 7/1993 | Mumola |
| 5,296,891 A | 3/1994 | Vogt et al. |
| 5,523,193 A | 6/1996 | Nelson |
| 5,969,441 A | 10/1999 | Loopstra et al. |

(Continued)

OTHER PUBLICATIONS

International Search Report and Written Opinion issued in corresponding PCT Patent Application No. PCT/EP2020/079650, dated Feb. 18, 2021.

*Primary Examiner* — Hung V Nguyen
(74) *Attorney, Agent, or Firm* — Pillsbury Winthrop Shaw Pittman, LLP

(57) ABSTRACT

An optical element and a lithographic apparatus including the optical element. The optical element includes a first member having a curved optical surface and a heat transfer surface, and a second member that comprises at least one recess, the at least one recess sealed against the heat transfer surface to form at least one closed channel between the first member and the second member to allow fluid to flow therethrough for thermal conditioning of the curved optical surface. In an embodiment, one or more regions of the heat transfer surface exposed to the at least one closed channel are positioned along a curved profile similar to that of the curved optical surface.

17 Claims, 8 Drawing Sheets

(56) References Cited

U.S. PATENT DOCUMENTS

| | | | |
|---|---|---|---|
| 6,046,792 A | 4/2000 | Van Der Werf et al. | |
| 7,106,414 B2* | 9/2006 | Tsuji | G03F 7/70875 |
| | | | 355/53 |
| 8,325,322 B2* | 12/2012 | Hauf | G02B 7/1815 |
| | | | 355/30 |
| 10,324,383 B2 | 6/2019 | Lafarre et al. | |
| 10,534,269 B2* | 1/2020 | Bauer | G02B 7/1815 |
| 2009/0122429 A1 | 5/2009 | Watson et al. | |
| 2011/0310368 A1 | 12/2011 | Schmitz et al. | |
| 2017/0315453 A1 | 11/2017 | Bauer et al. | |

* cited by examiner

OPTICAL COMPONENT AND CLAMP USED IN LITHOGRAPHIC APPARATUS

CROSS-REFERENCE TO RELATED APPLICATIONS

This application is the U.S. national phase entry of PCT Patent Application No. PCT/EP2020/079650, which was filed on Oct. 21, 2020, which claims the benefit of priority of U.S. Provisional Patent Application No. 62/931,906, which was filed on 7 Nov. 2019 and which is incorporated herein in its entirety by reference.

TECHNICAL FIELD

The present disclosure relates to an optical system of a lithographic machine. Particularly, an optical element, chucks, and clamps for holding objects of a lithographic apparatus and methods for controlling a temperature of an object held by a clamp of a lithographic apparatus.

BACKGROUND

A lithographic projection apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. It follows from CD equation that reduction of the minimum printable size of features can be obtained in three ways: by shortening the exposure wavelength $\lambda$, by increasing the numerical aperture NA, or by decreasing the value of k1.

To shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

The radiation generated by such sources will not, however, be only EUV radiation and the source may also emit at other wavelengths including infra-red (IR) radiation and deep ultra-violet (DUV) radiation. DUV radiation can be detrimental to the lithography system as it can result in a loss of contrast. Furthermore unwanted IR radiation can cause heat damage to components within the system. It is therefore known to use a spectral purity filter to increase the proportion of EUV in the transmitted radiation and to reduce or even eliminate unwanted non-EUV radiation such as DUV and IR radiation.

A lithographic apparatus using EUV radiation may require that the EUV radiation beam path, or at least substantial parts of it, must be kept in vacuum during a lithographic operation. In such vacuum regions of the lithographic apparatus, a clamp may be used to clamp an object, such as a patterning device and/or a substrate, to a structure of the lithographic apparatus, such as a chuck of a patterning device table and/or a substrate table, respectively.

In addition, a lithographic apparatus using EUV radiation may require temperature regulation of, for example, the patterning device and/or the substrate. Heat produced by the EUV radiation or the unwanted non-EUV radiation may cause deformations in, for example, the patterning device and/or the substrate during a lithographic operation because of the heat absorbed by the patterning device and/or the substrate. To reduce the deformation, a cooling fluid may be circulated through the clamp.

BRIEF SUMMARY

In an embodiment, there is provided an optical element including a first member having a curved optical surface and a heat transfer surface; and a second member comprises at least one recess, the at least one recess sealed against the heat transfer surface to form at least one closed channel between the first member and the second member to allow fluid to flow therethrough for thermal conditioning of the curved optical surface. In an embodiment, regions of the heat transfer surface exposed to the at least one closed channel are positioned along a curved profile similar to that of the curved optical surface.

Furthermore, there is provided a method of thermally conditioning a curved optical element used in a lithographic apparatus, the curved optical element including at least one closed channel, wherein regions at an heat transfer surface of the optical element that are exposed to the at least one closed channel are positioned along a curved profile similar to that of the curved optical element, the method includes delivering, via a pumps, a fluid as a heat transfer medium into the at least one closed channel of the curved optical element; receiving, via a temperature sensor, temperature values across the curved optical element, or receiving, via a model, heat distribution across the curved optical element; and controlling, based on the temperature values or the heat distribution, a property of the fluid to maintain a uniform temperature distribution across the curved optical element during imaging of a pattern using the lithographic apparatus.

Furthermore, there is provided a non-transitory computer-readable media comprising instructions that, when executed by one or more processors, cause operations of the method discussed herein.

Furthermore, there is provided a lithographic apparatus comprising an optical element. The optical element includes a first member having a curved optical surface and a heat transfer surface; and a second member comprises at least one recess, the at least one recess sealed against the heat transfer surface to form at least one closed channel between the first member and the second member to allow fluid to flow therethrough for thermal conditioning of the curved optical surface. In an embodiment, regions of the heat transfer surface exposed to the at least one closed channel are positioned along a curved profile similar to that of the curved optical surface

BRIEF DESCRIPTION OF THE DRAWINGS

Embodiments will now be described, by way of example only, with reference to the accompanying drawings in which.

Figure 1:
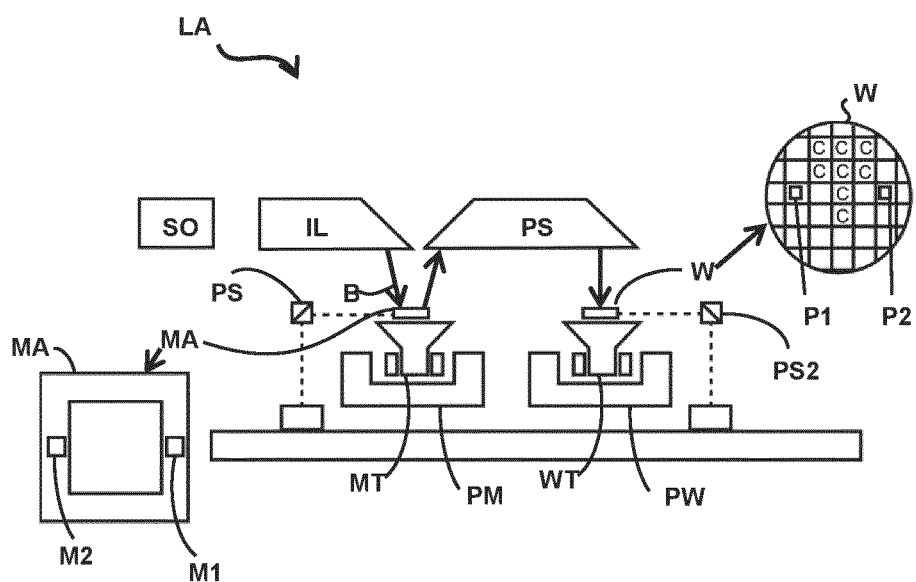
FIG. 1 is a schematic illustration of a reflective lithographic apparatus, according to an embodiment, according to an embodiment.

Embodiments will be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

Further, the lithographic projection apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

FIG. 1 schematically depicts an exemplary lithographic projection apparatus LA. The lithographic projection apparatus LA includes: a source collector module SO; an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be reflective (as in lithographic apparatus LA of FIG. 1) or transmissive. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus LA is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 1, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as faceted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LA could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 2:
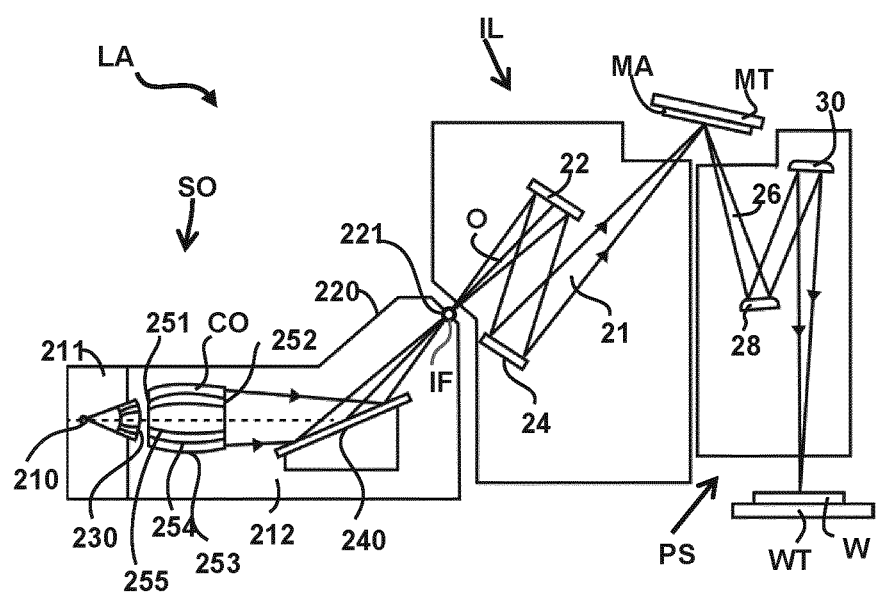
FIG. 2 is a more detailed view of the apparatus in FIG. 1, according to an embodiment.

FIG. 2 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 3:
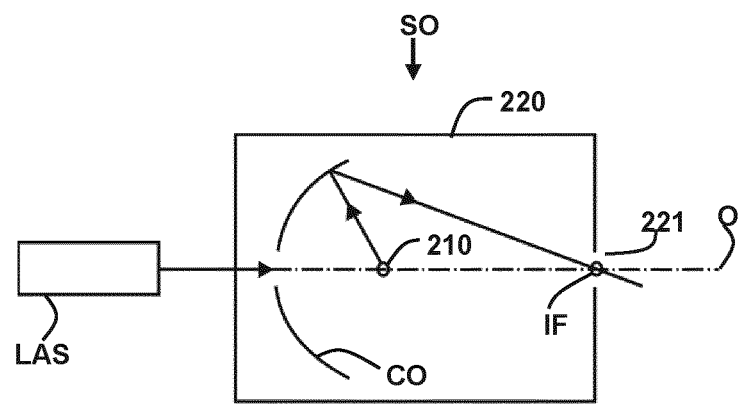
FIG. 3 is a more detailed view of the source collector module SO of the apparatus of FIGS. 2 and 3, according to an embodiment.

Alternatively, the source collector module SO may be part of an LPP radiation system as shown in FIG. 3. A laser LAS is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

Exemplary Embodiments of an Object Support

In some embodiments, a support of a lithographic apparatus is configured to hold an object and control the temperature of the object. The support can be a substrate table WT configured to hold substrate W or a support structure MT configured to hold patterning device MA as described above in FIGS. 1 and 2. The object can be, for example, a patterning device such as a mask or reticle as described above, or the object can be, for example, a substrate such as a wafer as described above. In some embodiments in which the object is a patterning device, patterning device imparts a pattern onto a beam of radiation incident on a surface of patterning device. When the object is clamped to the clamp, a surface of the object receives a radiation beam. When the object is exposed with an incident radiation beam, the object can absorb power from the radiation beam and heat up. When the object is heated, portions of the object can expand and deform. In some embodiments, to prevent or reduce deformation of object, the support can be configured to condition the object to be held at substantially room temperature (for example, about 22° C.) or any other defined operating temperature, according to various embodiments. The clamp is configured to act as a heat sink, and the clamp can be configured to be maintained at a temperature lower than the target average temperature of the object to accomplish this temperature control of the object. In some embodiments, the clamp is maintained at a temperature lower than the target temperature of object by passing a fluid conditioned to a target temperature through at least one channel defined by clamp. But over time, the cooling power of fluid passing through the at least one channel will also cool the chuck, causing deformation of the chuck which in turn leads to deformation of the clamp and the object. In an embodiment in which the object is a patterning device having a reflective surface, portions of the reflective surface can be deformed, causing unwanted image distortion at the substrate wafer. Additionally, deformation of the object can cause slip between the chuck and the object. Moreover, chuck deformations, by itself, can also lead to changes in the chuck metrology leading to chuck positioning errors and, consequently, image overlay errors at the substrate wafer.

To eliminate or reduce this deformation of the clamped object as well as chuck positioning errors due to deformation of the chuck, a support configured to hold an object of a lithographic apparatus can include a clamp with both (1) at least one channel configured to pass a fluid to condition a chuck at target temperature and (2) at least one separate channel configured to pass a fluid to condition the object at target temperatures in an embodiment. Additional discussion of chucks and clamps for holding objects of a lithographic apparatus and methods for controlling a temperature of an object held by a clamp of a lithographic apparatus is described in U.S. patent application Ser. No. 15/764,594, filed on Mar. 29, 2018, which is incorporated herein by reference in its entirety.

Figure 4:
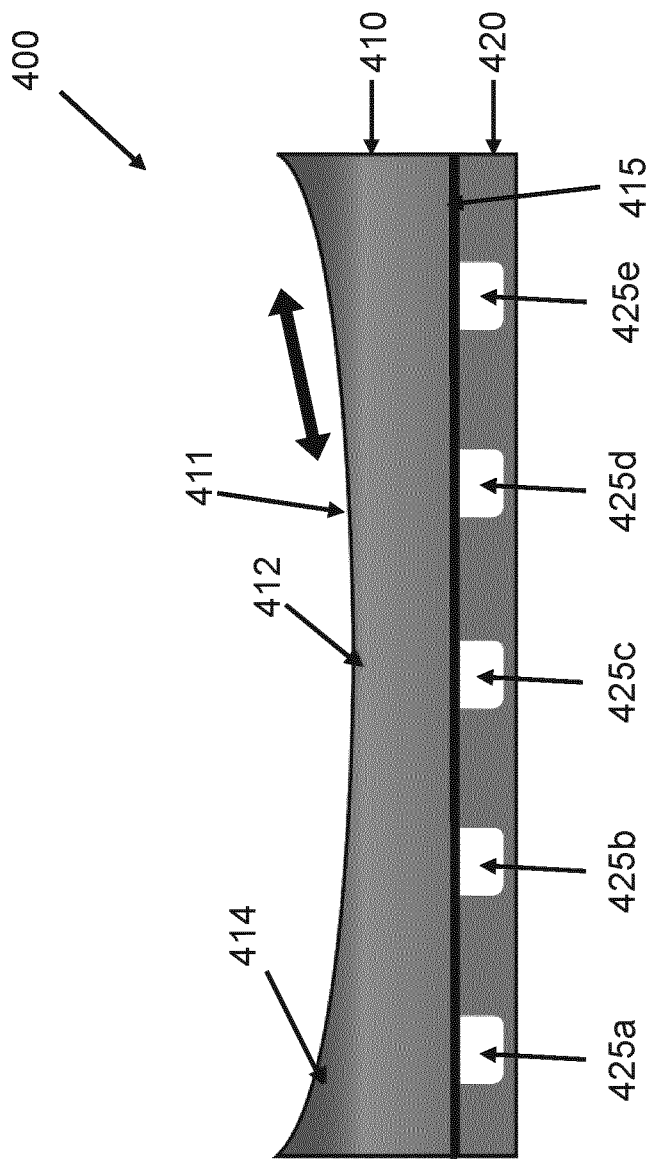
FIG. 4 illustrates a temperature gradient along a curved optical element, according to an embodiment.

FIG. 4 illustrates an example optical component (or element) 400 held by a clamp of the lithographic apparatus. For example, the optical element 400 any optical component included in e.g., illumination system and/or projection system of the lithographic apparatus e.g., of FIGS. 1-3. In an embodiment, the optical element 400 includes a first member 410 (e.g., mirror) having a reflective surface (e.g., 411). In an embodiment, the first member 410 has a curved profile. The first member 410 may be attached to a second member 420. In an embodiment, the second member 420 may be a portion of a clamp used to hold an object as discussed in FIGS. 1-3. In an embodiment, the second member may be a backing member of a mirror.

When radiation is incident on a curved optical surface 411 of the first member 410, a non-uniform thermal gradient is formed due to uneven heating caused by the incident radiation. For example, the thermal gradient is such that a center portion 412 of the optical surface is relatively cold and the temperature gradually increases toward ends of the optical surface. Thus, a cold center portion 412 and hot end portions 414 may be formed. In an embodiment, such thermal gradient across the optical surface can cause optical surface deformation (e.g., mirror deformation). Hence, a uniform thermal gradient or a uniform temperature across the optical surface is desired, such that the temperature is maintain below a temperature threshold.

To tackle the non-uniform thermal gradient issue, one or more cooling channels (e.g., 425*a*-425*e*) may be formed e.g., in EUV reticle and wafer clamps. In an embodiment, cooling channels are machined into a glass or ceramic plate. On top of the glass or ceramic place, another plate or a first member is attached to seal in the cooling channels. The cooling channels allow a cooling fluid (e.g., water) to pass through the channels in a controlled manner. Typically, reticle and wafer clamps have a substantially flat surfaces, and so this provides uniform cooling.

However, some of the optical components (e.g., mirrors), as show in FIG. 4, used in the lithographic apparatus are curved. Thus, employing channels enclosed by a flat surface, e.g., a bond line 415 between two flat surfaces of 410 and 420, may not improve the uniformity in the temperature gradient.

Alternative existing ways of cooling an optical component used in the lithographic apparatus include active heating for uniform heat load across the optical surface 411. For example, the EUV-induced heating can be compensative by actively heating remaining portions of the optical surface (e.g., 411) so that a uniform temperature is maintained across the optical surface (e.g., 411). However, such active heating also causes distortion in the optical element. Such distortion is not desired due to material variations and mounting distortions.

The present disclosure provides an optical element that improves the uniformity of the temperature gradient. For example, creating curved channels would bring a further cooling and uniformity improvement compared to the channels along bond line 415. In an example, the present disclosure provides machining one or more channels at varying depths in both the first member (e.g., 510 in FIG. 5) and a second member (e.g., 520 in FIG. 5) thereby a uniform channel distance can be achieved. Advantages of the present disclosure include, but not limited to, uniform thermal gradient across the optical surface of the first element (e.g., 510) resulting in a thermal distortion uniformity in curved surfaces.

Figure 5:
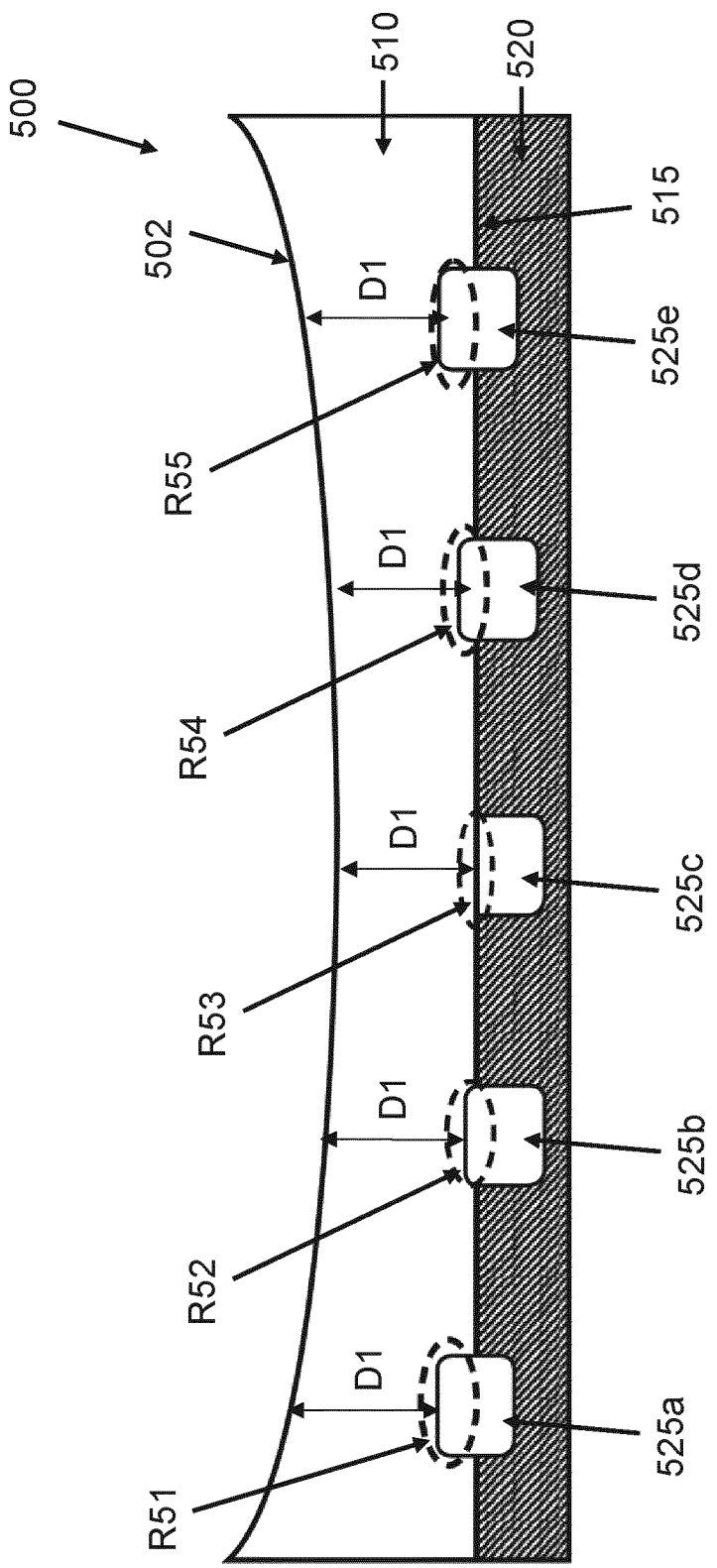
FIG. 5 illustrates an optical element including closed channels following a curved profile of an optical surface, according to an embodiment.
Figure 6:
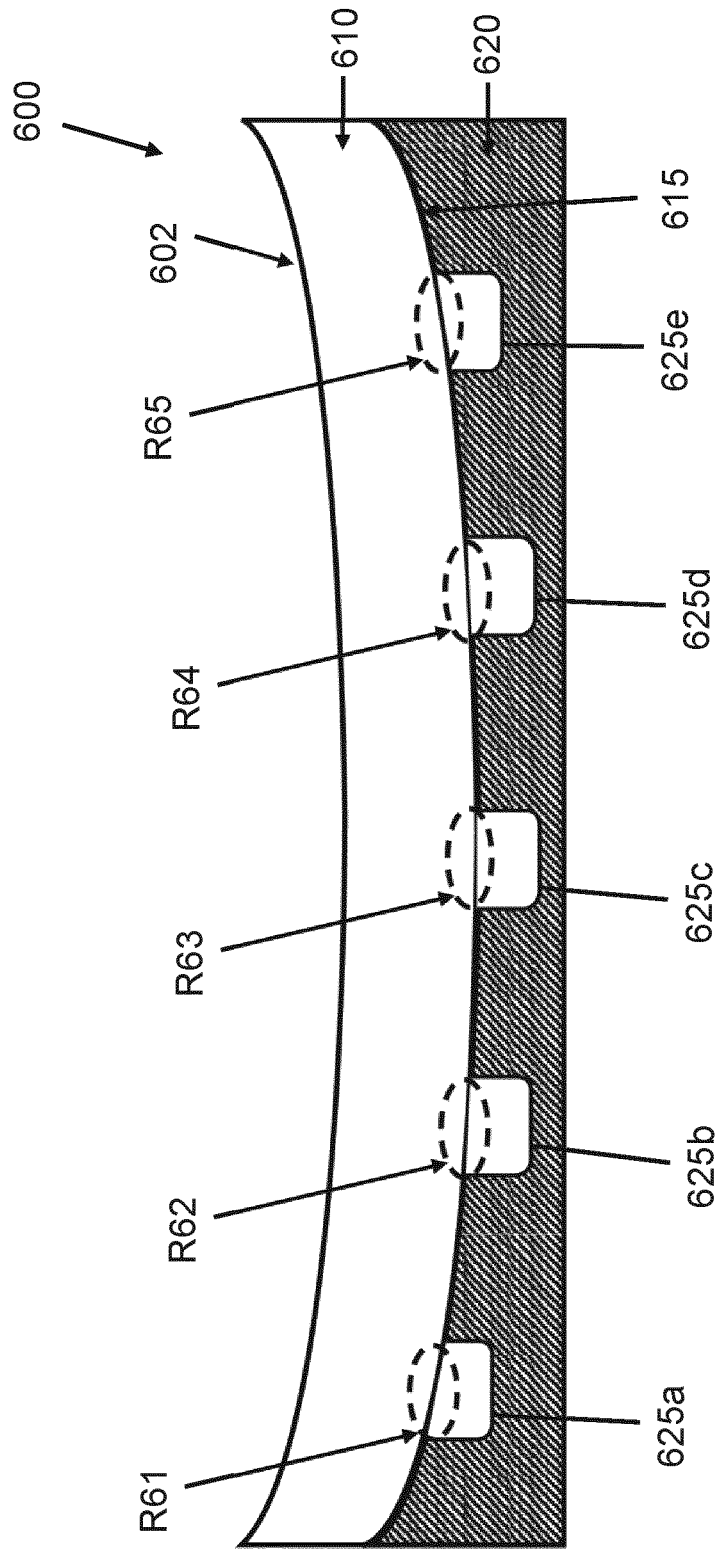
FIG. 6 illustrates another optical element including closed channels following a curved profile of an optical surface, according to an embodiment.

Referring to FIGS. 5 and 6 show a cross-sectional view of an object (e.g., an optical element) used in the lithographic apparatus. In an embodiment, an optical element (e.g., 500 in FIG. 5 or 600 in FIG. 6) includes a first member (e.g., 510 or 610) having a curved optical surface (e.g., 502 or 602) and a heat transfer surface (e.g., 515 or 615); and a second member (e.g., 520 or 620) comprises at least one recess, the at least one recess sealed against the heat transfer surface to form at least one closed channel between the first member and the second member to allow fluid to flow therethrough for thermal conditioning of the curved optical surface. In an embodiment, regions (e.g., R51-R55 or R61-R65) of the heat transfer surface exposed to the at least one closed channel are positioned along a curved profile similar to that of the curved optical surface (e.g., 502 or 602).

In an embodiment, the first member can be an optical component having the curved optical surface (e.g., 502 or 602) can be a reflective surface (e.g., mirror). The second member can be a backing or support at the back of the reflective surface. In an embodiment, the second member can be a portion of the clamp used to hold the optical component. In an embodiment, the first member and the second member are sealed against each other using fusion bonding or anodic bonding In an embodiment, the curved optical surface is at a first side where an incident beam (or reflected beam) is received. In an embodiment, the heat transfer surface is at a second side opposite to the first side of the curved optical surface. At the heat transfer surface, fluid may be passed through the closed channels to cool the curved optical surface of the first member.

In an embodiment, the heat transfer surface (e.g., at 515 in FIG. 5) includes a first set of recesses (e.g., portion of 525a-525e in the first member 510), where each recess of the first set of recesses has a region (e.g., R51, R52, R53, R54, or R55) located at a constant distance (e.g., D1) from the curved profile of the curved optical surface 502. For example, the distance D1 is determined from a center of the recess to the curved profile of the curved optical surface 502. In an embodiment, when a curve is fitted through the center of each of the recesses (e.g., center of portions of 525a-525e in the first member 510), the fitted curve follows the curved profile of the curved surface (e.g., 502). In an embodiment, a radius of curvature of the curved profile and the fitted curve are approximately the same. In an embodiment, the curved profile has a limited given radius of curvature, different from a flat surface.

In an embodiment, the second member (e.g., 520 or 620) includes a second set of recesses. For example, FIG. 5 illustrates the second set of recesses e.g., portions of 525a-525e formed in the first member 520. In another example, recesses 625a-625e are formed in the second member 620 in FIG. 6.

In an embodiment, the first set of recesses (e.g., portions of 525a-525e in 510) align with the second set of recessed (e.g., portions of 525a-525e in 520) to form the set of closed channels (e.g., 525a-525e) when the second member 520 is sealed against the heat transfer surface (e.g., at 515). The set of closed channels (e.g., 525a-525e) allow fluid to pass therethrough for thermal conditioning of the optical surface (e.g., 502). In an embodiment, a property (e.g., flow rate, pressure, temperature, etc.) of the fluid passed through the at least one closed channel or the set of closed channels is controlled such that the curved optical surface is maintained at a uniform heat gradient. In an embodiment, the fluid is a cooling fluid such as water.

In an embodiment, the first set of recesses of the heat transfer surface and the second set of recesses of the second member are formed along a direction tangential to the curved profile of the curved optical surface.

In an embodiment, the heat transfer surface is a flat surface. For example, referring to FIG. 5, the flat surface is a surface at a bond line 515. In an embodiment, the heat transfer surface is a curved surface having the curved profile of the curved optical surface. For example, referring to FIG. 6, the heat transfer surface 615 is a curved surface. In an embodiment, the heat transfer surface and the second member are sealed against each other using fusion bonding or anodic bonding.

Referring to FIG. 5, the optical element 500 includes recesses in both the first member 510 and the second member 520. In an embodiment, the first member 510 and the second member 520 has a flat bond line 515 that optically contacts and fuses the members 510 and 520.

In an embodiment, recesses are machined into both surfaces of the first member 510 and the second member 520. Further, the recesses are aligned while maintaining optical contact integrity of two machined surfaces. Further, the members 510 and 520 are fused. In an embodiment, curved profile followed by arrangements of the closed channels 525a-525e is limited by a channel depth that can be machined in members 510 and 520. In an embodiment, a channel geometry can be varied by varying a channel width, a channel depth, and/or a channel spacing, while following a curved profile of the curved optical surface 502.

As shown in FIG. 5, the optical element 500 includes the first member 510 and the second member 520. The first member 510 has the optical surface 502 and the first heat transfer surface 515, where the optical surface 502 has a curved profile and the first heat transfer surface includes a first set of recesses, each recess located at a constant distance D1 with respect to the curved profile of the optical surface 502. For example, regions R51, R52, R53, R54, and R55 are formed such that a center of the regions R51-R55 are at a constant distance D1 from the curved profile of the optical surface 502. Thus, when fluid comes in contact with these regions R51-R55, heat is uniformly transferred from the optical surface 502 to the fluid thereby maintaining a substantially constant temperature across the optical surface 502.

The second member 520 includes a second heat transfer surface, where the second heat transfer surface includes a second set of recesses. The second heat transfer surface is attached to the first heat transfer surface at the flat bond line 515 such that the first set of recesses and the second set of recesses form a closed set of channels 525a-525e to allow fluid to pass through the closed set of channels for thermal conditioning of the optical surface.

In an embodiment, the property (e.g., flow rate, pressure, temperature) of the fluid passed through the closed set of channels 525a-525e is controlled such that the optical surface 502 is maintained at a uniform thermal gradient.

Referring to FIG. 6, the optical element 600 includes recesses only in the second member 620 (e.g., clamps as discussed in FIGS. 1-3). In an embodiment, the first member 610 and the second member 620 has a curved bond line 615 that optically contacts and fuses the members 610 and 620. In an embodiment, the curved bond line 615 closely matches a concave or convex profiles of the curved optical surface 502. Since, recesses are included only in the second member 502, alignment is simpler, e.g., only curved surfaces at the bond line 615 should be matched and fused to form the optical element 600.

In an embodiment, a channel geometry can be varied by varying the curvature of the bonding surfaces at the bond line 615. In an embodiment, the channel geometry can be varied by varying a channel width, a channel depth, and/or a channel spacing, while following a curved profile of the curved optical surface 602.

As shown in FIG. 6, the optical element 600 includes the first member 610 having an optical surface 602 and a first heat transfer surface at 615. The optical surface 602 and the first heat transfer surface at the bond line 615 have a curved profile. In an embodiment, the curved profile at the bond line 615 refers to a curve fitted at regions R61, R62, R63, R64, and R65 that are exposed to the set of channels 525a-625e.

As the regions R61-R65 are at a constant distance from the curved profile of the optical surface 602. Thus, when fluid comes in contact with these regions R61-R65, heat is uniformly transferred from the optical surface 602 to the fluid thereby maintaining a substantially constant temperature across the optical surface 602

The second member 620 includes a second heat transfer surface at the bond line 615. The second heat transfer surface has the curved profile and includes a set of recesses, where the second heat transfer surface is attached to the first heat transfer surface such that the set of recesses form a closed set of channels 625a-625e to allow fluid to pass through the closed set of channels for thermal conditioning of the optical surface.

In an embodiment, the property (e.g., flow rate, pressure, temperature) of the fluid passed through the closed set of channels 625a-625e is controlled such that the optical surface 502 is maintained at a uniform thermal gradient.

In an embodiment, a lithographic apparatus may include an optical element (e.g., 500 and/or 600). The optical element includes a first member having a curved optical surface and a heat transfer surface; and a second member comprises at least one recess, the at least one recess sealed against the heat transfer surface to form at least one closed channel between the first member and the second member to allow fluid to flow therethrough for thermal conditioning of the curved optical surface. In an embodiment, regions of the heat transfer surface exposed to the at least one closed channel are positioned along a curved profile similar to that of the curved optical surface.

Figure 7:
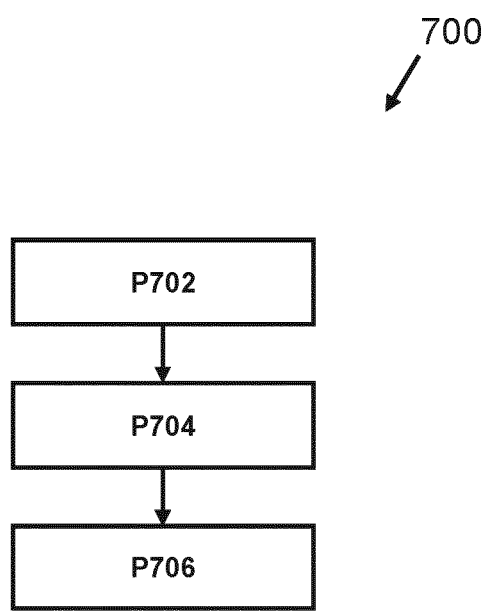
FIG. 7 is a flow chart of an example method for thermal conditioning of a curved optical element of FIGS. 5 and 6, according to an embodiment.

FIG. 7 is a flow chart of an example method for thermal conditioning of a curved optical element (e.g., the optical element 500 or 600 of FIG. 5 or FIG. 6, discussed herein) used in a lithographic apparatus. As discussed earlier, the curved optical element including at least one closed channel (e.g., one of the channels 525a-525e or 625a-625e in FIG. 5 or 6), wherein regions (e.g., R51-R55 or R61-R65) at an heat transfer surface of the optical element that are exposed to the at least one closed channel are positioned along a curved profile similar to that of the curved optical element. In embodiment, the method includes following example procedures.

Procedure P702 includes delivering, via a pumps (not shown), fluid as a heat transfer medium into the at least one closed channel of the curved optical element (e.g., 500 and 600). In an embodiment, the pump can be any pump used in a cooling system used in the lithographic apparatus.

Procedure P704 includes receiving, via a temperature sensor (not shown), temperature values across the curved optical element (e.g., 500 and 600). In an embodiment, the temperature values may be estimated via a model. The model is configured to generate a heat distribution across the curved optical element. For example, the modeling of the heat distribution is based on an illumination pattern and illumination intensity of the curved optical element. Based on the model, temperature values can be estimated at any location on the lens during operation of the lithographic apparatus. Then, based on the estimated temperatures, the flow rates through the channels can be adjusted accordingly. In this case, there is not temperature feedback, rather open loop control is based on model based estimations. Hence, active monitoring of the temperature may not used.

Procedure P706 includes controlling, based on the temperature values, a property of the fluid to maintain a uniform temperature distribution across the curved optical element during imaging of a pattern using the lithographic apparatus. For example, the property of the fluid includes, but not limited to, one or more of: a temperature, a pressure, and/or a flow rate.

In an embodiment, the controlling of the property of the fluid includes determining a location on the curved optical element having relatively high temperature values; identifying one or more closed channels of the set of closed channels that are nearest to the determined location; and adjusting the property of the fluid within the one or more closed channels so that temperature at the determined locations is maintained within a desired temperature range. In an embodiment, the desired temperature range is determined based on mean and variance in the temperature values across the curved optical element.

In an embodiment, the one or more procedures of the method 700 can be implemented as instructions (e.g., program code) in a processor of a computer system (e.g., process 104 of computer system 100). In an embodiment, the procedures may be distributed across a plurality of processors (e.g., parallel computation) to improve computing efficiency. In an embodiment, the computer program product comprising a non-transitory computer readable medium has instructions recorded thereon, the instructions when executed by a computer implementing the method 700.

In an embodiment, the above method can be implement on a processor or provided on a non-transitory computer-readable media. For example, a non-transitory computer-readable media (e.g., memory) comprising instructions that, when executed by one or more processors, cause operations including delivering, via a pumps, a fluid as a heat transfer medium into at least one closed channel of a curved optical element; receiving, via a temperature sensor, temperature values across a curved optical element, or receiving, via a model, heat distribution across the curved optical element; and controlling, based on the temperature values or the heat distribution, a property of the fluid to maintain a uniform temperature distribution across the curved optical element during imaging of a pattern using the lithographic apparatus. As discussed herein regions at a heat transfer surface of the curved optical element that are exposed to the at least one closed channel are positioned along a curved profile similar to that of the curved optical element.

According to present disclosure, the combination and sub-combinations of disclosed elements constitute separate embodiments. For example, a first combination includes an optical element having recess in both a first member (e.g., 510) and the second member (e.g., 520). A second combination may include an optical element having recess only in the second member (e.g., 620) and bond line (e.g., 615) being curved. In another combination, a lithographic apparatus comprises an optical element. The optical element includes a first member having a curved optical surface and a heat transfer surface; and a second member comprises at least one recess, the at least one recess sealed against the heat transfer surface to form at least one closed channel between the first member and the second member to allow fluid to flow therethrough for thermal conditioning of the curved optical surface. In an embodiment, regions of the heat transfer surface exposed to the at least one closed channel are positioned along a curved profile similar to that of the curved optical surface.

Figure 8:
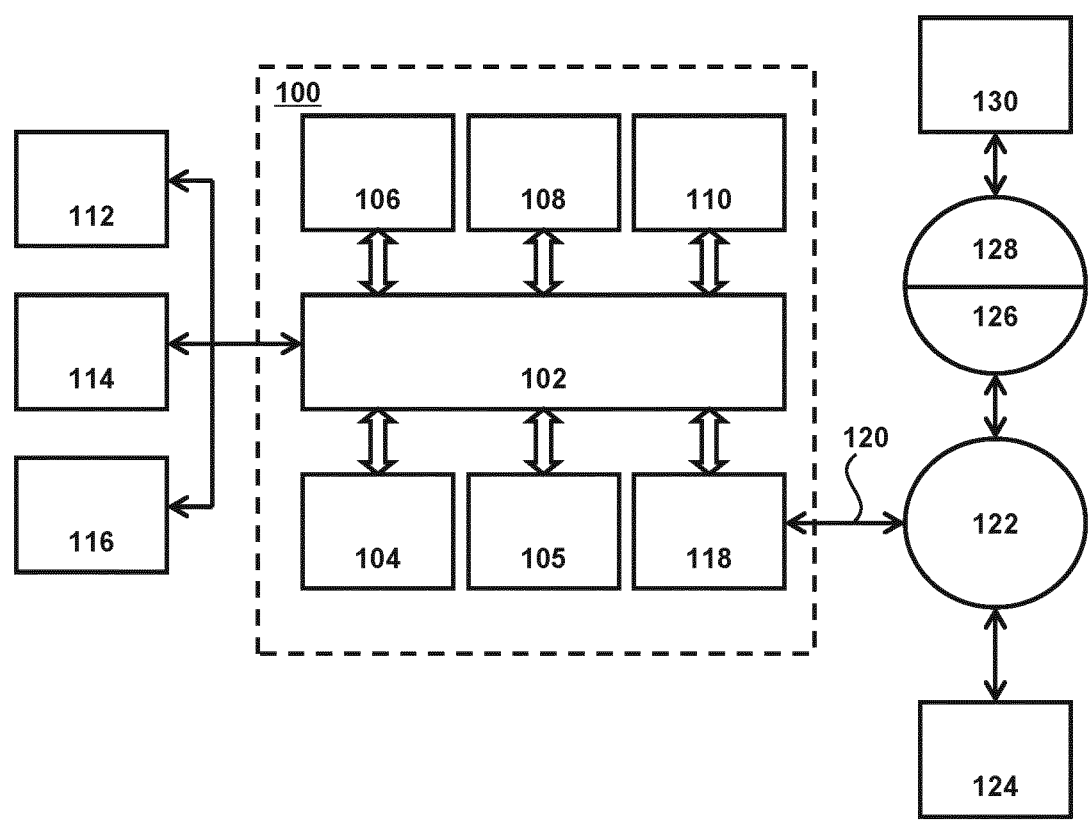
FIG. 8 is a block diagram of a computer system.

FIG. 8 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Other aspects of the invention are set out in the following numbered clauses.

1. An optical element comprising:
    a first member having a curved optical surface and a heat transfer surface; and
    a second member comprises at least one recess, the at least one recess sealed against the heat transfer surface to form at least one closed channel between the first member and the second member to allow fluid to flow therethrough for thermal conditioning of the curved optical surface, wherein regions of the heat transfer surface exposed to the at least one closed channel are positioned along a curved profile similar to that of the curved optical surface.
2. The optical element of clause 1, wherein the curved optical surface is at a first side where an incident beam is received.
3. The optical element of clause 2, wherein the heat transfer surface is at a second side opposite to the first side of the curved optical surface.
4. The optical element of any of clauses 1-3, wherein the heat transfer surface is a flat surface.
5. The optical element of any of clauses 1-3, wherein the heat transfer surface is a curved surface having the curved profile of the curved optical surface.
6. The optical element of any of clauses 1-5, wherein the heat transfer surface and the second member are sealed against each other using fusion bonding or anodic bonding.
7. The optical element of any of clauses 1-6, wherein the heat transfer surface includes a first set of recesses, each recess of the first set of recesses having a region located at a constant distance from the curved profile of the curved optical surface.
8. The optical element of any of clauses 1-7, wherein the second member includes a second set of recesses.
9. The optical element of any of clauses 7-8, wherein the first set of recesses align with the second set of recessed to form a set of closed channels when the second element is sealed against the heat transfer surface, the set of closed channels allowing fluid to pass therethrough for thermal conditioning of the optical surface.
10. The optical element of any of clauses 7-9, wherein the first set of recesses of the heat transfer surface and the second set of recesses of the second member are formed along a direction tangential to the curved profile of the curved optical surface.
11. The optical element of any of clauses 1-10, wherein a property of the fluid passed through the at least one closed channel or the set of closed channels is controlled such that the curved optical surface is maintained at a uniform heat gradient.
12. The optical element of any of clauses 1-11, wherein the fluid is a cooling fluid.
13. The optical element of any of clauses 1-12, wherein the curved profile has a limited given radius of curvature.
14. A method of thermally conditioning a curved optical element used in a lithographic apparatus, the curved optical element including at least one closed channel, wherein regions at an heat transfer surface of the optical element that are exposed to the at least one closed channel are positioned along a curved profile similar to that of the curved optical element, the method comprising:
delivering, via a pumps, a fluid as a heat transfer medium into the at least one closed channel of the curved optical element;
receiving, via a temperature sensor, temperature values across the curved optical element, or receiving, via a model, heat distribution across the curved optical element; and
controlling, based on the temperature values or the heat distribution, a property of the fluid to maintain a uniform temperature distribution across the curved optical element during imaging of a pattern using the lithographic apparatus.

15. The method of clause 14, wherein the curved optical element includes a set of closed channels.
16. The method of clause 15, wherein the controlling of the property of the fluid comprises:
determining a location on the curved optical element having relatively high temperature values;
identifying one or more closed channels of the set of closed channels that are nearest to the determined location; and
adjusting the property of the fluid within the one or more closed channels so that temperature at the determined locations is maintained within a desired temperature range.
17. The method of any of clauses 14-16, wherein the desired temperature range is determined based on mean and variance in the temperature values across the curved optical element.
18. The method of any of clauses 14-17, wherein the property of the fluid comprises: a temperature, a pressure, and/or a flow rate.
19. The method of any of clauses 14-18, wherein the model is configured to generate the heat distribution is based on an illumination pattern and/or an illumination intensity at the curved optical element.
20. A non-transitory computer-readable media comprising instructions that, when executed by one or more processors, cause operations comprising:
delivering, via a pumps, a fluid as a heat transfer medium into at least one closed channel of a curved optical element;
receiving, via a temperature sensor, temperature values across a curved optical element, or receiving, via a model, heat distribution across the curved optical element; and
controlling, based on the temperature values or the heat distribution, a property of the fluid to maintain a uniform temperature distribution across the curved optical element during imaging of a pattern using the lithographic apparatus,
wherein regions at an heat transfer surface of the curved optical element that are exposed to the at least one closed channel are positioned along a curved profile similar to that of the curved optical element.
21. A lithographic apparatus comprising:
an optical element comprising:
a first member having a curved optical surface and a heat transfer surface; and
a second member comprises at least one recess, the at least one recess sealed against the heat transfer surface to form at least one closed channel between the first member and the second member to allow fluid to flow therethrough for thermal conditioning of the curved optical surface,
wherein regions of the heat transfer surface exposed to the at least one closed channel are positioned along a curved profile similar to that of the curved optical surface.
22. The lithographic apparatus of clause 21, wherein the curved optical surface is at a first side where an incident beam is received.
23. The lithographic apparatus of clause 22, wherein the heat transfer surface is at a second side opposite to the first side of the curved optical surface.
24. The lithographic apparatus of any of clauses 21-23, wherein the heat transfer surface is a flat surface.

25. The lithographic apparatus of any of clauses 21-23, wherein the heat transfer surface is a curved surface having the curved profile of the curved optical surface.
26. The lithographic apparatus of any of clauses 21-25, wherein the heat transfer surface and the second member are sealed against each other using fusion bonding or anodic bonding.
27. The lithographic apparatus of any of clauses 21-26, wherein the heat transfer surface includes a first set of recesses, each recess of the first set of recesses having a region located at a constant distance from the curved profile of the curved optical surface.
28. The lithographic apparatus of any of clauses 21-27, wherein the second member includes a second set of recesses.
29. The lithographic apparatus of any of clauses 27-28, wherein the first set of recesses align with the second set of recessed to form a set of closed channels when the second element is sealed against the heat transfer surface, the set of closed channels allowing fluid to pass therethrough for thermal conditioning of the optical surface.
30. The lithographic apparatus of any of clauses 27-29, wherein the first set of recesses of the heat transfer surface and the second set of recesses of the second member are formed along a direction tangential to the curved profile of the curved optical surface.
31. The lithographic apparatus of any of clauses 21-30, wherein a property of the fluid passed through the at least one closed channel or the set of closed channels is controlled such that the curved optical surface is maintained at a uniform heat gradient.
32. The lithographic apparatus of any of clauses 21-31, wherein the fluid is a cooling fluid.
33. The lithographic apparatus of any of clauses 21-32, wherein the curved profile has a limited given radius of curvature.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

The invention claimed is:

1. An optical element comprising:
a first member having a curved optical surface and a heat transfer surface; and
a second member that comprises at least one recess, the at least one recess sealed against the heat transfer surface to form at least one closed channel between the first member and the second member to allow fluid to flow therethrough for thermal conditioning of the curved optical surface,
wherein one or more regions of the heat transfer surface exposed to the at least one closed channel are positioned along a curved profile similar to that of the curved optical surface, and
wherein the heat transfer surface is a flat surface.

2. The optical element of claim 1, wherein the curved optical surface is at a first side where an incident beam is received.

3. The optical element of claim 2, wherein the heat transfer surface is at a second side opposite to the first side of the curved optical surface.

4. The optical element of claim 1, wherein the heat transfer surface is a curved surface having the curved profile similar to that of the curved optical surface.

5. The optical element of claim 1, wherein the heat transfer surface and the second member are sealed against each other by fusion bonding or anodic bonding.

6. The optical element of claim 1, wherein the heat transfer surface includes a first set of recesses, each recess of the first set of recesses having a region located at a substantially constant distance from the curved profile of the curved optical surface.

7. The optical element of claim 1, wherein the second member includes a second set of recesses.

8. The optical element of claim 7, wherein the heat transfer surface includes a first set of recesses and wherein the first set of recesses align with the second set of recessed to form a set of closed channels when the second element is sealed against the heat transfer surface, the set of closed channels allowing fluid to pass therethrough for thermal conditioning of the optical surface.

9. The optical element of claim 7, wherein the heat transfer surface includes a first set of recesses and wherein the first set of recesses of the heat transfer surface and the second set of recesses of the second member are formed along a direction tangential to the curved profile of the curved optical surface.

10. The optical element of claim 1, wherein a property of the fluid passed through the at least one closed channel is controlled such that the curved optical surface is maintained at a uniform heat gradient.

11. The optical element of claim 1, wherein the fluid is a cooling fluid.

12. A method of thermally conditioning an optical element having a curved optical surface used in a lithographic apparatus, the optical element including a set of closed channels, wherein regions at a heat transfer surface of the optical element that are exposed to the set of closed channels are positioned along a curved profile similar to that of the curved optical surface, the method comprising:
delivering, via a pump, a fluid as a heat transfer medium into the set of closed channels of the optical element;
receiving, via a temperature sensor, temperature values across the curved optical surface, or receiving, via a model, a heat distribution across the curved optical surface; and
controlling, based on the temperature values or the heat distribution, a property of the fluid to maintain a uniform temperature distribution across the optical element during imaging of a pattern using the lithographic apparatus, wherein the controlling comprises:
determining a location on the curved optical surface having relatively high temperature values;
identifying one or more closed channels of the set of closed channels that are nearest to the determined location; and
adjusting the property of the fluid within the one or more closed channels so that temperature at the determined locations is maintained within a desired temperature range.

13. The method of claim 12, wherein the desired temperature range is determined based on mean and variance in the temperature values across the curved optical surface.

14. The method of claim 12, wherein the property of the fluid comprises: a temperature, a pressure, and/or a flow rate.

15. The method of claim 12, comprising receiving, via a model, a heat distribution across the curved optical surface and wherein the model is configured to generate the heat distribution based on an illumination pattern and/or an illumination intensity at the curved optical surface.

16. A non-transitory computer-readable media comprising instructions therein, the instructions, when executed by one or more processors, configured to cause at least:
   delivery, via a pump, of a fluid as a heat transfer medium into a set of closed channels of an optical element having a curved surface;
   receipt, via a temperature sensor, of temperature values across the curved surface, or receipt, via a model, of a heat distribution across the curved surface; and
   control, based on the temperature values or the heat distribution, of a property of the fluid to maintain a uniform temperature distribution across the curved surface during imaging using the optical element, wherein the control comprises: determination of a location on the curved optical surface having relatively high temperature values; identification of one or more closed channels of the set of closed channels that are nearest to the determined location; and adjustment of the property of the fluid within the one or more closed channels so that temperature at the determined locations is maintained within a desired temperature range, wherein regions at a heat transfer surface of the optical element that are exposed to the set of closed channels are positioned along a curved profile similar to that of the curved surface.

17. An optical element comprising:
   a first member having a curved optical surface and a heat transfer surface; and
   a second member that comprises at least one recess, the at least one recess sealed against the heat transfer surface to form at least one closed channel between the first member and the second member to allow fluid to flow therethrough for thermal conditioning of the curved optical surface,
   wherein one or more regions of the heat transfer surface exposed to the at least one closed channel are positioned along a curved profile similar to that of the curved optical surface, and
   wherein the heat transfer surface includes a first set of recesses, each recess of the first set of recesses having a region located at a substantially constant distance from the curved profile of the curved optical surface.

* * * * *